United States Patent [19]

Wintzer et al.

[11] 4,396,907
[45] Aug. 2, 1983

[54] DIGITAL TO ANALOG CONVERTER WHICH USES MAIN AND AUXILIARY RESISTOR NETWORKS

[75] Inventors: Klaus Wintzer, Munich; Peter Picard, Taufkirchen, both of Fed. Rep. of Germany

[73] Assignee: Siemens Aktiengesellschaft, Berlin & Munich, Fed. Rep. of Germany

[21] Appl. No.: 309,036

[22] Filed: Oct. 6, 1981

Related U.S. Application Data

[63] Continuation of Ser. No. 63,921, Aug. 6, 1979, abandoned.

[30] Foreign Application Priority Data

Aug. 17, 1978 [DE] Fed. Rep. of Germany ....... 2836079

[51] Int. Cl.$^3$ ............................................ H03K 13/02
[52] U.S. Cl. ......................... 340/347 C; 340/347 AD; 340/347 DA; 340/347 M; 370/7
[58] Field of Search ... 340/347 M, 347 AD, 347 DA, 340/347 C; 370/7

[56] References Cited

U.S. PATENT DOCUMENTS 3,582,941 6/1971 LeMaout et al. .
4,021,800 5/1977 Katagiri et al. ............. 340/347 AD
4,138,667 2/1967 Vogel .

OTHER PUBLICATIONS

The Engineering Staff of Analog Devices, "Analog–Digital Conversion Handbook" 6/1972 pp. 11-36-II-39.
Landee et al., Electronic Designers' Handbook, McGraw Hill Book Co., Inc., 1957, pp. 23-31 and 23-32.
Cecil et al., CMOS-Engineering For 10-Bit-D/A Converter Electronik Praxis, 2/1975, p. 32, No. ½.

Primary Examiner—T. J. Sloyan
Attorney, Agent, or Firm—Hill, Van Santen, Steadman, Chiara & Simpson

[57] ABSTRACT

A digital-analog converter functioning according to the $\mu$-law wherein a sequence control receives an input digital signal and controls the position of a plurality of switches so as to selectively apply positive or negative voltages to a main resistor network and an auxiliary resistor network and further controls the plurality of switches in such networks for either grounding or connecting to an operational amplifier the outputs of said main and auxiliary resistor networks so as to produce an analog output signal. The invention is useful in time division multiplex telephone systems with digital subscriber stations, for example.

5 Claims, 4 Drawing Figures

DIGITAL TO ANALOG CONVERTER WHICH USES MAIN AND AUXILIARY RESISTOR NETWORKS

This is a continuation of application Ser. No. 63,921 filed Aug. 6, 1979, abandoned.

BACKGROUND OF THE INVENTION

1. Field of the Invention

This invention relates in general to digital to analog converters for conversion of digital-analog signals.

2. Description of the Prior Art

It is known in digital-analog converters of the type specified for example, in "Elektronik-Praxis", No. ½, February 1975, pages 32ff to provide a logarithmic companding characteristic line which corresponds to the CCITT recommendation and operates according to the so-called A-law which utilizes non-linear steep-drop characteristic curves.

Companding according to such a characteristic curve in the analog-digital conversion or corresponding digital to analog conversion is required so as to assure that the ratio of the analog signal amplitude to the interference voltage amplitude caused by the quantization of the analog signal is approximately constant over a wide analog signal amplitude range.

In addition to the logarithmic characteristic curve which follows the A-law, the CCITT recommends a further logarithmic characteristic curve which obeys the so-called $\mu$-law. Although the characteristic curve obeying the A-law can be approached in a particularly favorable manner in terms of circuitry by means of a non-linear steep-drop characteristic curve the $\mu$-characteristic curve is preferred in certain countries.

SUMMARY OF THE INVENTION

The invention relates to a digital-analog converter for conversion of digital signals having $n+m+1$ bits into analog signals utilizing a non-linear steep-drop characteristic curve which consists of $2^m$ linear sections per signal half wave with $2^n$ amplitude stages having a resistor network (R-2R-Network) weighting current stage using a binary value gradation and consisting of parallel and series resistors having resistance values of R and 2R, respectively, and in which a constant current of negative or positive polarity is supplied to the junction of the series and parallel resistors at one end of the network and depending on the binary value of the bits specifying the operational sign in the digital signal which is to be converted. The low ends of the parallel resistors on the side opposite from the series resistors can be selectively switched in groups of directly neighboring low ends according to the n-bits of the respectively digital signals formed by means of a binary "1" from grounded potential at binary "0" to a common sum path conducting the summation current formed from the individual parallel resistors and wherein the one limiting low end of such a group which faces the end of the network is more or less spaced from such end of the network according to the binary value of the m bits of the respective digital signal and whereby at least one of the low ends adjacent the other limiting low end of the group is separately connected to the sum current path so as to assure that not all of the n+m bits have the binary value of 0.

In the prior art systems utilizing the so-called A-law a compander corresponding to a characteristic curve in analog-digital conversion or digital to analog conversion is required so as to assure that the ratio of the analog signal amplitude to the interference voltage amplitude caused by the quantization of the analog-signal is approximately constant over a wide analog signal amplitude range.

Also, in addition to the logarithmic characteristic curve obeying the A-law, the CCITT recommends an additional logarithmic characteristic curve which obeys the so-called $\mu$-law. Although the characteristic curve obeying the A-law can be utilized in a particularly favorable manner in terms of circuitry by the use of non-linear steep drop characteristic curve, the $\mu$-characteristic curve is preferred in certain countries.

The solution of the A-characteristic curve with the use of a non-linear steep-drop characteristic curve with eight respective characteristic curve sections for a characteristic curve half is shown in FIG. 1. The corresponding entries of 0 and 1 show how the individual groups of the low end resistors are connected in a specific combination to the common current path or, respectively, remain separated from the common current path. In this specification, the low end resistors are understood to mean the parallel branch resistors. In the example illustrated in FIG. 1, the current weighting of the resistor network utilizes 12 of the parallel resistors. It is also to be seen from FIG. 1 that starting with the second characteristic curve section with the insertion of respectively the next highest current weighting, the corner value for a characteristic curve is inserted and the corresponding combination of insertion or non-insertion of the values of the other plurality of weighting functions illustrates the representation of the stages within the segments.

Figure 2:
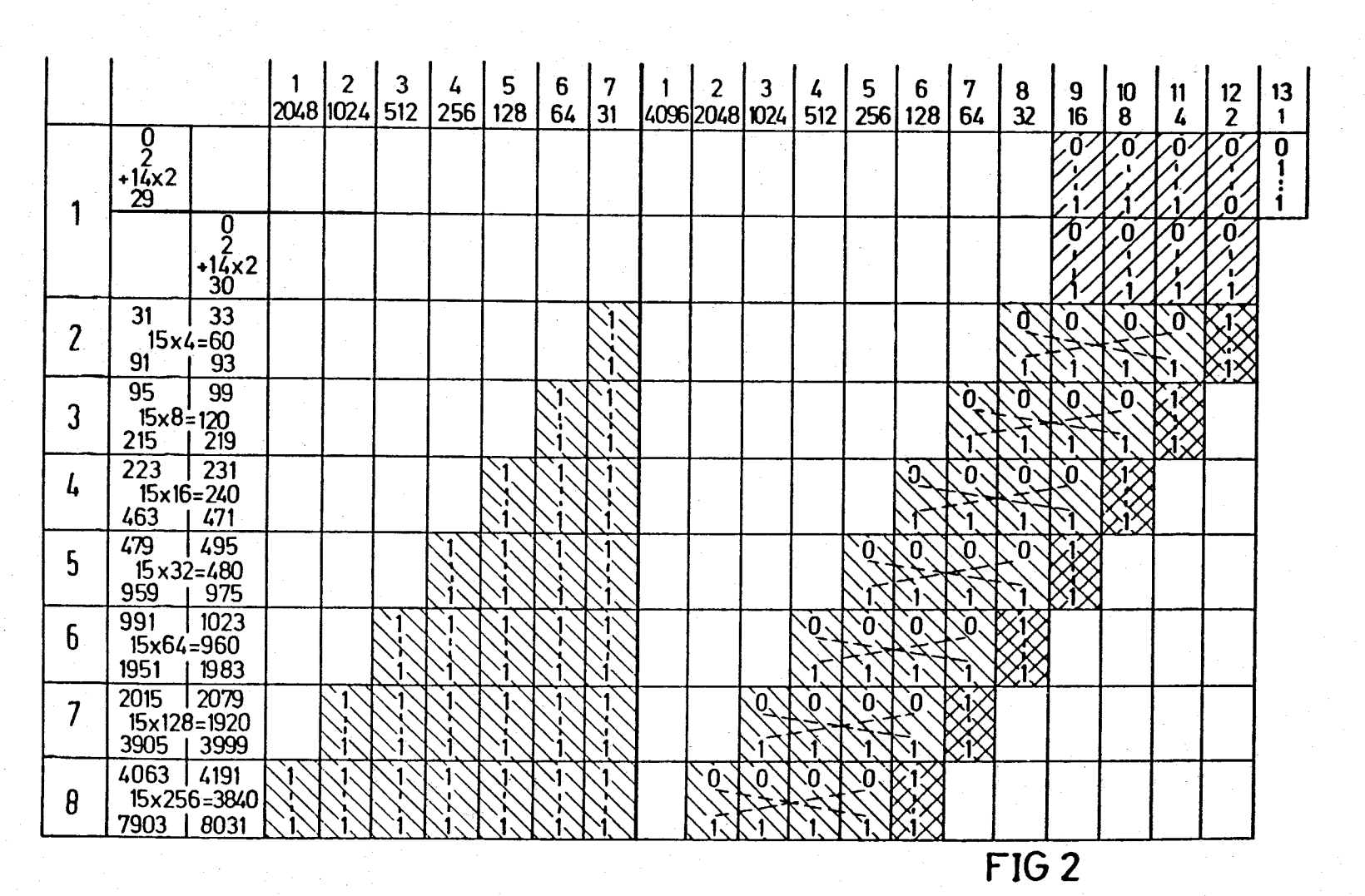

FIG. 2 illustrates the relationship between the characteristic curve following the $\mu$-law and the values of a non-linear steep-drop characteristic curve are illustrated. In this Figure, it is seen that at the individual characteristic curve sections, current weightings which are required for the representation of the characteristic curve corner values are also required for the representation of stages within the segments. Therefore, in addition to the resistor network having 12 switchable parallel resistors which illustrate the stages within the characteristic curve segments, an additional resistor network having 7 switchable parallel resistors is required which determine the segment corner values. The additional cost with respect to the realization of the characteristic curve obeying the A-law is thus considerable.

It is an object of the present invention to provide a digital-analog converter of the type which functions with non-linear steep-drop characteristic curve obeying the $\mu$-law and which is not significantly more expensive than the known digital-analog converters which obey the A-law.

This object is achieved in that for conversion of a steep-drop characteristic curve obeying the $\mu$-law, an auxiliary network consisting of parallel resistors and series resistors is provided to which a constant current is respectively supplied which has a polarity that is opposite to the current supply to the main resistor network and which supplies a partial current to the common sum current path by way of a switchable parallel resistor which has an amplitude that is half as large as that of the partial current which is supplied from the switchable parallel resistor of the main network that is located at the greatest distance from the constant current input. Insofar as all of the m bits do not have the binary value of "0" in that the group of low ends of the main network which is at the greatest distance from the start of the network which is determined when none of the m bits has the binary value of "1" has n low ends in contrast to which the remaining groups of low ends have n+1 low ends and in that corresponding to the inter-relationship given by the μ-law even with groups of the main network having m+1 only $2^n$ combination possibilities of current conducting switchable parallel resistors are utilized. Also, more or less the low ends are separately applied to the sum current path are utilized in the main and/or auxiliary network and are more or less spaced from the additional limiting low end of the main network or respectively from the current input of the auxiliary network.

According to a further development of the invention, it is taught how a digital-analog converter must be modified so as to be able to be employed in conjunction with a coder functioning according to the iterative principle. This modification consists in the invention in that in the main resistor network no low ends outside of the groups of low ends are separately applied to the common sum current path and in the auxiliary network the low ends of the switchable parallel resistor is only not connected to the sum current path when all of the n+m bits of the digital signal to be processed have the binary value of "0" and is separately applied together with the individual groups of low ends of the main resistor network to the sum current path corresponding to the low ends of at least one further switchable parallel resistor provided by the μ-law coding operation by which the sum current path a current with an amplitude is supplied through a parallel resistor of the main network spaced a distance from the further limiting low end of the particular group of low end resistors.

Other objects, features, and advantages of the invention will be readily apparent from the following description of certain preferred embodiments thereof taken in conjunction with the accompanying drawings although variations and modifications may be effected without departing from the spirit and scope of the novel concepts of the disclosure and in which:

BRIEF DESCRIPTION OF THE DRAWINGS

FIG. 1 illustrates a graph of the arrangements of resistors in a system following the A-law;

FIG. 2 illustrates the relationship between the characteristic curve following μ-law and the values of a non-linear steep-drop characteristic curve;

FIG. 4 illustrates the inter-relationship between digital signals to be converted and the parallel resistors to be connected upon operation of the inventive circuit.

DESCRIPTION OF THE PREFERRED EMBODIMENTS

Figure 3:
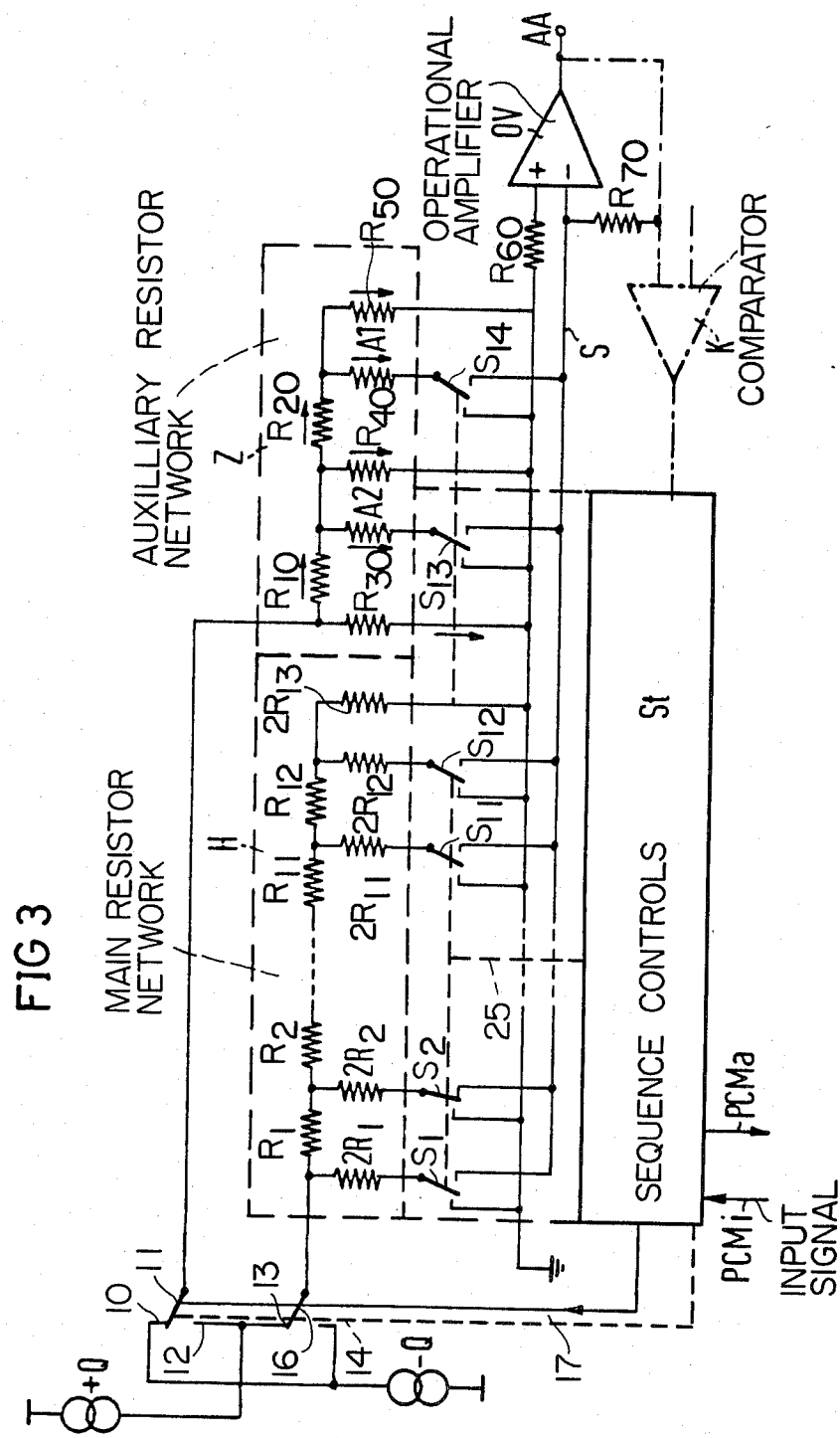
FIG. 3 comprises a circuit diagram of the digital analog converter of the invention.

In FIG. 3, the portion of the schematic illustrated with the exception of that shown in dash dot line consists of the digital to analog conversion means for the digital signals that consists of n+m+1=4+3+1 bits. The comparator K and the connecting lines illustrated in dash dot line are utilized when a digital analog converter is employed as a component part of a coder functioning according to the iterative principle which will be described later in this specification.

The main components of the invention consists of the main resistor network H comprising a plurality of series connected resistors $R_1$–$R_{12}$ and parallel connected resistors $2R_1$–$2R_{13}$, and the auxiliary resistor network Z comprising the series resistors R10–R20 and the parallel resistors R30, A2, R40, A1, and R50. Constant current sources of both negative and positive polarity are supplied from the current source plus Q and −Q through switch 16 which is movable to engage contacts 13 and 14 respectively, so as to selectively apply positive or negative current to the main resistor network H as shown. Such current is applied to the first series resistor $R_1$ and the first parallel resistor $2R_1$. The parallel resistors $2R_1$ through $2R_{12}$ are respectively connected to switches S1 through S12 which are movable to connect the lower ends of the resistors $2R_1$ through $2R_{12}$ either to ground through a lead 18 or to the input sum conductor S for the operational amplifier OV. The resistor $2R_{13}$ is connected from resistor R12 to ground through the lead 18. The low ends of the parallel resistors $2R_1$ through $2R_{12}$ are selectively switched to the sum current path signal S is a binary "1" exists in their associated position. The one limiting low end resistor of such a group which is at the end of the network to which the constant current is supplied is spaced from the network end according to the value of the m bits of the respective digital signal formed by means of a binary "1". If not all of the m bits in the digital signal to be converted have the binary value of "0" at least one low end parallel resistor next to the other limiting low end resistor of the group is separately connected to the sum current path S.

The auxiliary resistor network Z consists of series resistors R10, R20 and R50 connected to ground through lead 18 and parallel resistors R30 and R40 connected as shown with their other ends connected to ground lead 18 and parallel resistors A2 and A1 which are respectively connected to the switches S13 and S14 so as to selectively connect their current paths either to ground through lead 18 or to the sum current conductor S. In the present invention, the resistor A1 is utilized for the digital analog conversion. The switchable parallel resistor A2 is illustrated in FIG. 3 and is used in conjunction with the employment of the illustrated circuit arrangement as a component part of an analog digital converter which will be discussed further in the specification.

The constant current is supplied from switch 11 that is engageable with contacts 10 and 12 to respectively apply either negative or positive current to the junction between the resistors R10 and R30 which are at the left end of the auxiliary network Z. In the present invention, the polarity of the current applied by switch 11 to the auxiliary resistor network Z is always opposite to the polarity of the current applied by switch 16 to the main resistor network H.

The series and parallel resistors of the auxiliary network Z are selected to have values such that the amplitude of the current supplied by way of the switchable parallel resistor A1 to the sum current path S is one-half as large as that current suppliable through the last or twelfth switchable parallel resistor $2R_{12}$ of the main resistor network H.

The actuation of the switches S1 through S12 and S13 and S14 and the switches 11 and 16 are controlled by mechanical linkage 17 and 25 by a sequence control St which receives the input digital signals at an input PCMi. The sequence control St controls both the polarity of the constant current by controlling the switches 11 and 16 as well as controls the grounding of the parallel resistors of the main and auxiliary networks H and Z.

Figure 4:
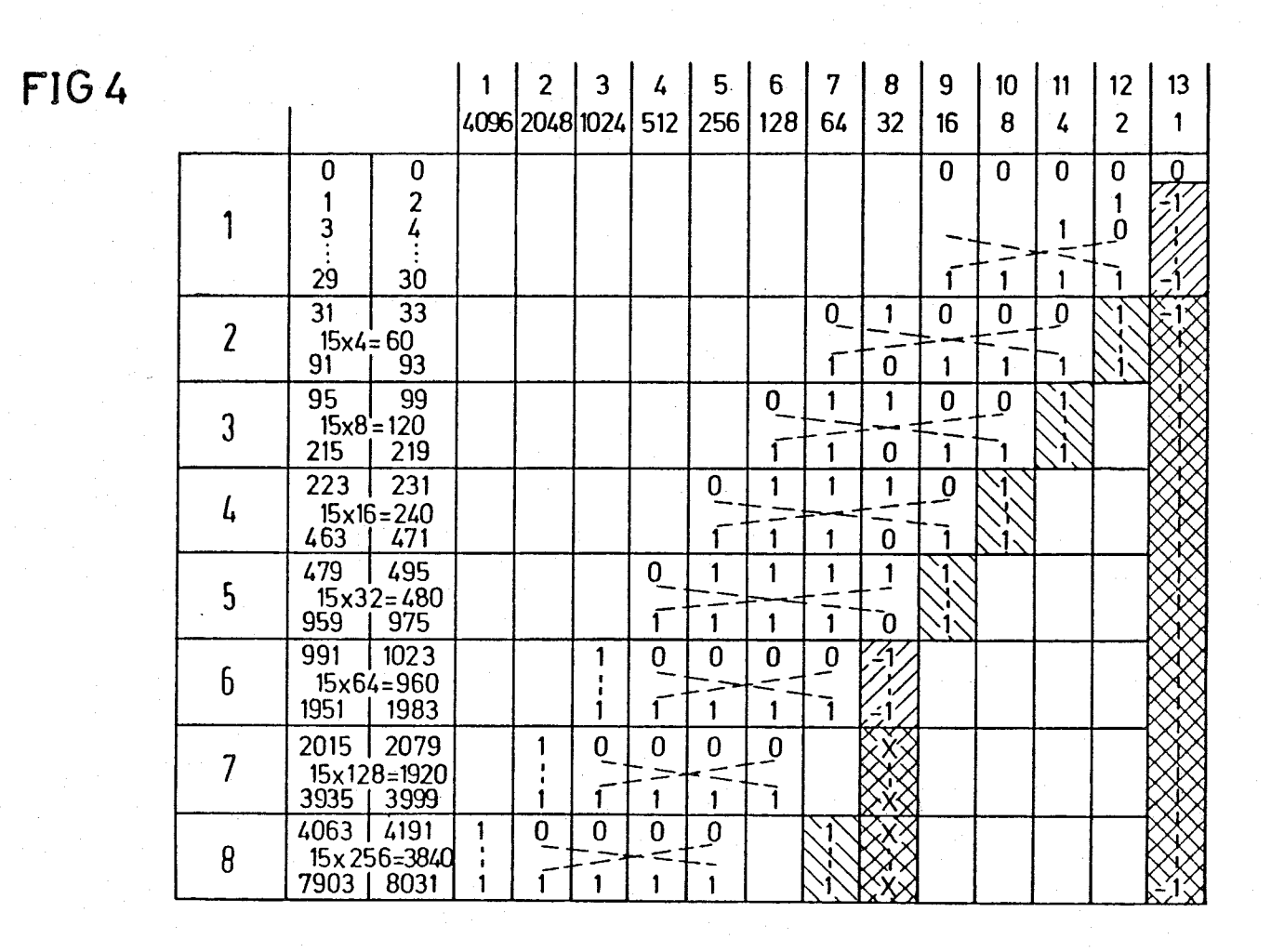

Additional operating explanation of the circuit of FIG. 3 will be given relative to FIG. 4. In FIG. 4, columns 1 through 12 illustrate and correspond to the parallel resistors $2R_1$ through $2R_{12}$ of the main resistor network H illustrated in FIG. 3. Column 1 corresponds to the parallel resistor $2R_1$ which receives the constant current input and which supplies the most significant current weighting part of the output signal. Thus, columns 2 through 12 correspond to the parallel resistors $2R_2$ through $2R_{12}$ with the output from resistor $2R_{12}$ supplying the least significant current weighting of the main current network. Column 13 designates the switchable parallel resistor A1 of the auxiliary network Z which supplies the current weighting which is the lowest of all of the output signals.

In FIG. 4, where a "1" is entered in the columns, this means that the parallel end switch S1 through 12 and S14 respectively, is switched such that current is applied to the common current path S through the corresponding parallel resistor. If a "−1" is in the column, this means that the current is applied with the polarity that is opposite to the current supplied to the parallel resistors of the main network H. When "0" is inserted in FIG. 4, this means that the parallel resistor is not connected to the common current path S but is connected to the grounded terminal 18. The framing of the 0/1 combinations illustrates groups of junctions which are respectively determinant for the conversion process. These groups of which 8 are present, respectively connect to other junctions and are more or less spaced from one end of the network of the main network H to which the constant current is supplied depending on which combination of m bits of the digital signal is to be respectively converted and exhibit the binary values of "0" and "1". These serve for the representation of various characteristic curve sections 1 through 8 of the one-half of a non-linear steep-drop characteristic curve. If none of the m bits in the digital signal to be converted have the binary value of "1", the group of determinant junctions is at the furthest distance from the input end of the network whereas if on the other hand all of the m bits have the binary value of "1" then the group of determining junctions lies at the input end of the network. The shading in FIG. 4 indicates those locations of the main network wherein a parallel resistor is separately applied to the sum current path in addition to the respective groups of the low end resistors. The shading which extends downwardly to the left relates to the decoding operation which will be first described and the shading which extends upwardly to the right relates to a coding operation which will be discussed further in the specification.

As shown in FIG. 4, the parallel resistor A1 of the auxiliary network Z illustrated in FIG. 3 is connected to the sum current path S if not all of the m bits in the digital signal to be converted have the binary value of "0".

In the groups of junctions of the main network H which correspond to the characteristic curve sections 2 through 5, a directly adjacent parallel resistor will be separately applied to the sum current path S on the side that faces away from the input end of the network where the constant current is supplied, independently of the combination of connections of the parallel resistors within the group concerned.

In the group of parallel resistors which corresponds to the characteristic curve section 6, a separate connection is not utilized. As far as the group of junctions corresponding to the characteristic curve section 6 is determinate, the parallel resistor applied separately to the sum current path S is present but as shown in FIG. 4 is not directly adjacent the group of parallel resistors. Since in coding operations as will be discussed later, the relationships are different x is entered in the Figure. (See colum 8) When the group of parallel resistors which correspond to the eighth characteristic curve section is determinate 2 parallel resistances are present which are connected to the sum current path S which also are not directly adjacent the group of junctions.

Also, it can be noted from FIG. 4 that the groups of parallel resistors which correspond to the first characteristic curve section utilize n=4 parallel resistors whereas the other groups on the other hand involve n+1=5 bleeder resistors.

In the groups utilizing n+1 bleeder resistors only $2^n$ combination possibility of parallel resistors connected in the sum current path S and remaining separate from sum current path S are utilized and this is indicated in the Figure by indicating the respective first and last combinations within a group. This limitation is accomplished by the sequence control St which causes n bits in the digital signals to be converted into corresponding combinations of n+1 bits according to the connection of the parallel resistors which exist.

According to the inventive concept, the main network described as well as the use of the auxiliary network which in specific cases supplies the lowest current weighting function with a respective opposite operational sign, the gradation or stepping of the individual characteristic curve sections listed under column DEC of FIG. 4 occur which corresponds to the CCITT recommendation for the representation of a companding characteristic curve according to the $\mu$-law by means of a steep-drop characteristic curve. See in this regard CCITT recommendation, Vol. III-RECG 711, pages 375 and 376.

Figure 1:
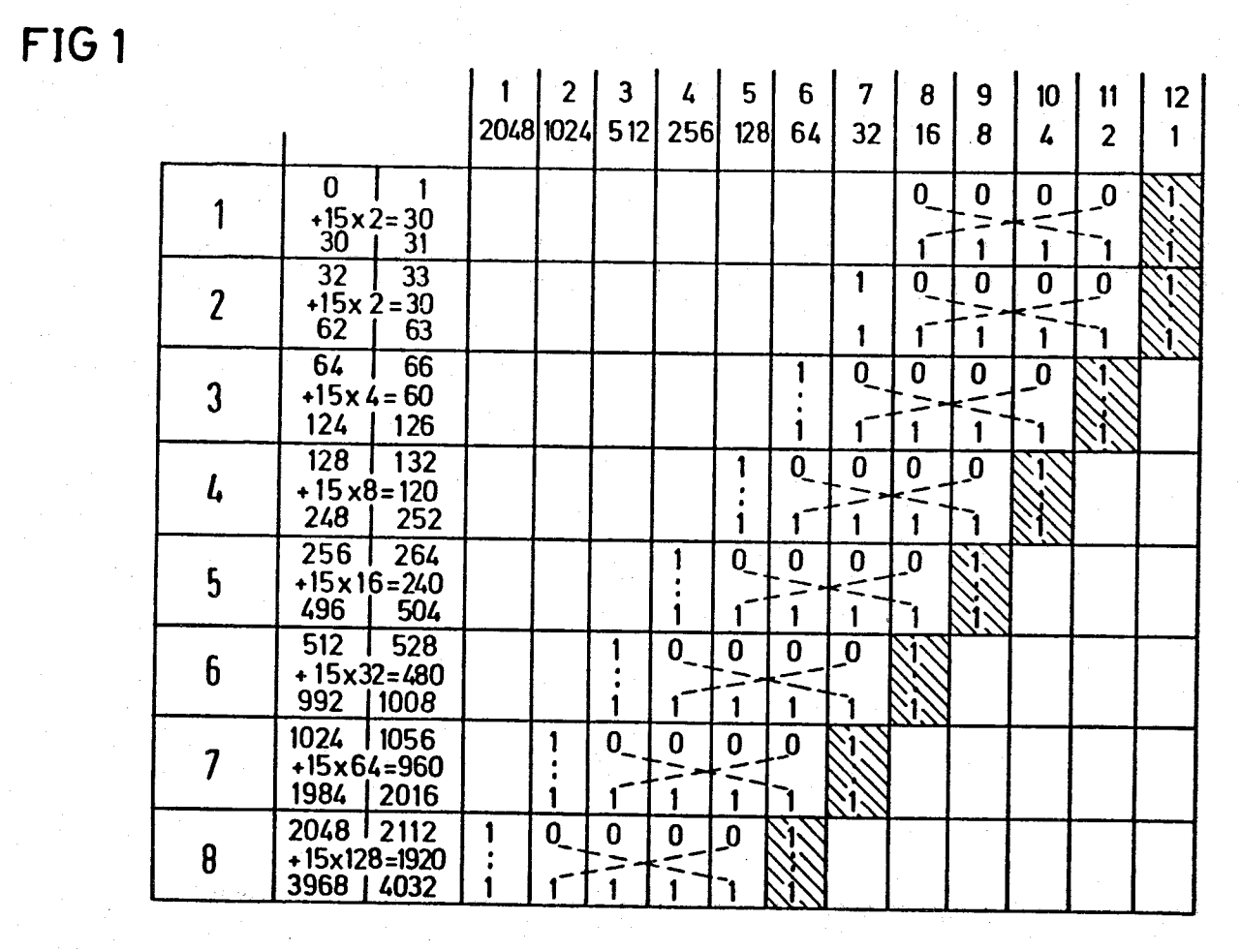

When the digital analog converter of the invention is used as a component part of a coder functioning according to the iterative principle, the comparator K illustrated in dot dash lines is connected as shown in FIG. 3 to the circuit already illustrated. It is to be realized, of course, that the analog output occurs at the output of the operational amplifier OV at terminal AA. The analog signal occurring at output AA of the operational OV is supplied to one input terminal of the analog value comparator K and is compared with the analog signal which is to be converted which is supplied on conductor S to the operational amplifier OV. The resistor R70 is connected between conductor S and the input to the comparator K. The output of the comparator supplied by the comparison on the basis of the difference between the input signals decides whether a digital signal set in the sequence control St which digital signal has led to the delivery of the analog signal at the analog output AA, should be altered to the next highest binary value or not. If so, the comparison described above is repeated if necessary so that the analog signal amplitude of the current supplied to the sum current path S or respectively, the amplitude of the analog signal occurring at the output terminal AA will be gradually adapted to the amplitude of the analog signal to be converted. Such a conversion process is known as, for example, see German OS No. 2,315,986, FIG. 1 and U.S. Pat. No. 3,234,544 and thus will not be described in greater detail herein since such disclosures are incorporated by reference herein.

The auxiliary network Z has an additional switchable parallel resistor A2 for the coding operation. The series resistors and additional parallel resistors connected to ground are selected in such a manner that current with the same amplitude is supplied by way of parallel resistor A2 to the sum current path S as is supplied by the eighth switchable parallel resistor $2R_8$ of the main resistor network H and thus corresponds to the current weighting value 32 as illustrated in FIG. 4.

Deviating from the relationships previously described and is shown in FIG. 4, no current will be supplied to the sum current path S by way of the first switchable parallel resistor A1 of the auxiliary network Z only when all of the $n+m$ bits have the binary of "0". Also, insofar as the groups of the parallel resistors of the main network correspond to the characteristic curve section 2 through 5 are determinate, the separate connection of a parallel resistor adjacent the parallel resistor limiting group is lacking. Insofar as the groups of parallel resistors of the main network H correspond to the characteristic curve sections 6 through 8 are determinate, the second parallel resistor A2 in the auxilary network Z is also applied to the sum current path S in addition to the first parallel resistor A1 so that in all three cases a current having the current weight of 32 is supplied, however, with a polarity which is opposite to the polarity of the currents supplied by way of the parallel resistors $2R_1$ through $2R_{12}$ of the main resistor network H. In contrast to the relationships in the decoding operation where the currents with this current weighting had the same polarity as the remaining current weighting in the characteristic curve sections 6 through 8. For realizing the characteristic curve section 8, an additional connection of a parallel resistor is not required in the main network.

The other characteristic features, in other words, the employment of groups of $n+1$ junctions insofar as the characteristic curve sections 2 through 8 are concerned as well as the employment $2^n$ combinational possibilities of junctions for switching the current over are the same as upon the operation of the circuit arrangement as a pure digital to analog converter.

Thus, the sum currents which the resistor network supplies to the sum current path S form a stepped sequence as is illustrated in FIG. 4 under column labelled Cod and which likewise corresponds to the CCITT recommendation for coding according to the $\mu$-law as described in Vol. III-RecG 711, pages 375 and 376.

Thus, in the present invention, a very simple modification can be made to a network which solves the nonlinear steep-drop characteristic curve of the A-law can be made by merely adding the auxiliary network Z which has two switchable parallel resistors.

Although the invention has been described with respect to preferred embodiments, it is not to be so limited as changes and modifications may be made therein which are within the full intended scope as defined by the appended claims.

We claim as our invention:

1. A digital to analog converter for converting digital signals having $n+m+1$ bits into analog signals, comprising a sequence control receiving said digital signals as input data, a main resistor network having a plurality of series resistor R and a plurality of parallel resistors 2R having a plurality of switched parallel branches of which $n+1$ are selectively subject to signal control as a function of m which defines the segment and which is driven by a plus or minus constant current source selectively by the sign bit, a sum current conductor, a plurality of switches $S_1-S_{12}$ connected between said plurality of parallel resistors and said sum current conductor, a positive and negative fixed current source, a second switch connected between the input to said main resistor network and said positive and negative fixed current source, an auxiliary resistor network having at least one parallel resistor which carries one-half the current of the current through the least significant 2R branch of the main network and is opposite in sense thereto, a third switch connected between said auxiliary resistor network and said sum current conductor, a fourth switch connected between said auxiliary resistor network and said positive and negative fixed current source to apply a current having the opposite polarity to said main and auxiliary resistor networks, and said sequence control positioning said plurality of switches $S_1-S_{12}$, said second, third and fourth switches as a function of said input data.

2. A digital to analog converter according to claim 1 wherein all of said plurality of series resistors have the same impedance R and all of said plurality of parallel resistors have the same impedance, 2R.

3. A digital to analog converter according to claim 2 wherein the current through said third switch is one half the current through the one of said plurality of resistors of said main resistors network which is connected to said sum current conductor and is furthest from the input to said main resistor network.

4. A digital to analog converter according to claim 3 including an operational amplifier connected to said sum current conductor.

5. An analog to digital converter for converting analog signals to digital signals comprising a sequence control receiving said digital signals as input data, a main resistor network having a plurality of series resistors R and a plurality of parallel resistors 2R having a plurality of switched parallel branches of which $n+1$ are selectively subject to signal control as a function of m which defines the segment and which is driven by a plus or minus constant current source selectively by the sign bit, a sum current conductor, a plurality of switches $S_1-S_{12}$ connected between said plurality of parallel resistors and said sum current conductor, a positive and negative fixed current source, a second switch connected between the input to said main resistor network and said positive and negative fixed current source, an auxiliary resistor network having at least one parallel resistor which carries one-half the current of the current through the least significant 2R branch of the main network and is opposite in sense thereto, a third switch connected between said auxiliary resistor network and said sum current conductor, a fourth switch connected between said auxiliary resistor network and said positive and negative fixed current source to apply a current having the opposite polarity to said main and auxiliary resistor networks, and said sequence control positioning said plurality of switches $S_1-S_{12}$, said second, third and fourth switches as a function of said input data, and including a comparator connected between the output of said operational amplifier and said sequence control for iterative operation and which operates as an analog-digital transducer.

* * * * *